(12) United States Patent
Akula et al.

(10) Patent No.: US 8,929,843 B2
(45) Date of Patent: Jan. 6, 2015

(54) ANTENNA POWER COUPLER HAVING A VARIABLE COUPLING FACTOR

(75) Inventors: Prashanth Akula, San Diego, CA (US); David Maldonado, Rancho Santa Fe, CA (US); Kevin Hsi Huai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/333,757

(22) Filed: Dec. 21, 2011

(65) Prior Publication Data

US 2013/0072142 A1 Mar. 21, 2013

Related U.S. Application Data (60) Provisional application No. 61/537,020, filed on Sep. 20, 2011.

(51) Int. Cl.
*H01Q 11/12* (2006.01)
*H04B 1/00* (2006.01)
*H03G 3/30* (2006.01)
*H04B 17/00* (2006.01)

(52) U.S. Cl.
CPC ............. *H04B 1/005* (2013.01); *H03G 3/3042* (2013.01); *H04B 17/0032* (2013.01)
USPC ........ 455/126; 455/78; 455/114.2; 455/114.3; 455/115.1; 455/115.3; 300/2; 300/279; 300/284; 300/207 P (58) Field of Classification Search
USPC .............................. 455/126, 78, 114.2, 114.3, 455/115.1–115.4; 330/2, 279, 284, 207 P
See application file for complete search history.

(56) References Cited

U.S. PATENT DOCUMENTS

| | | | |
|---|---|---|---|
| 4,709,403 A | | 11/1987 | Kikuchi |
| 5,412,414 A | * | 5/1995 | Ast et al. ...................... 342/174 |
| 5,710,991 A | | 1/1998 | Lee |
| 5,995,853 A | | 11/1999 | Park |
| 7,515,884 B2 | * | 4/2009 | Blech et al. ................. 455/127.1 |
| 7,915,954 B2 | | 3/2011 | Raghupathy et al. |
| 8,405,374 B2 | * | 3/2013 | Tomita et al. ................. 323/284 |
| 2007/0026838 A1 | | 2/2007 | Staudinger et al. |
| 2009/0042521 A1 | * | 2/2009 | Otaka et al. .................... 455/126 |
| 2009/0160784 A1 | * | 6/2009 | Ishida ............................ 345/173 |
| 2009/0256630 A1 | * | 10/2009 | Brobston ......................... 330/2 |
| 2010/0159851 A1 | * | 6/2010 | Endo et al. ...................... 455/78 |
| 2010/0195547 A1 | | 8/2010 | Vice et al. |
| 2011/0201287 A1 | | 8/2011 | Pratt et al. |

FOREIGN PATENT DOCUMENTS

| | | |
|---|---|---|
| EP | 0859464 A2 | 8/1998 |
| JP | 2006237925 A | 9/2006 |
| JP | 2007329642 A | 12/2007 |

OTHER PUBLICATIONS

International Search Report and Written Opinion—PCT/US2012/056431—ISA/EPO—Jan. 7, 2013.

* cited by examiner

*Primary Examiner* — Junpeng Chen
(74) *Attorney, Agent, or Firm* — Ramin Mobarhan (57) ABSTRACT

An antenna power coupler having a variable coupling factor is disclosed. In an exemplary embodiment, an apparatus includes a coupler configured to generate a power detection signal based on transmit signal power associated with a plurality of transmission technologies and a variable attenuator configured to apply a selected attenuation factor to the power detection signal to generate an adjusted power detection signal, the selected attenuation factor associated with a selected transmission technology.

20 Claims, 6 Drawing Sheets

ANTENNA POWER COUPLER HAVING A VARIABLE COUPLING FACTOR

CLAIM TO PRIORITY

This patent application claims the benefit of priority from U.S. Provisional Patent Application No. 61/537,020, entitled "ANTENNA POWER COUPLER HAVING A VARIABLE COUPLING FACTOR" filed on Sep. 20, 2011, and assigned to the assignee hereof and hereby expressly incorporated by reference herein.

BACKGROUND

1. Field

The present application relates generally to the operation and design of antenna systems for use with mobile devices, and more particularly, to the design and operation of antenna power couplers.

2. Background

There is an increasing demand to have wireless devices capable of high quality transmission and reception over multiple frequency bands. Using multiple frequency bands provides for increased data transmission speeds and/or added services. Unfortunately, the wireless device needs to perform power calibration for each frequency band. This has resulted in increased calibration times.

Another concern for various wireless devices is that transmit power may couple back to the transceiver and degrade operation or even damage components. For example, in third generation (3G) and fourth generation (4G) technologies, a maximum rated power of 24 dBm can appear at the antenna. However, in second generation (2G) systems, up to 33 dBm can appear at the antenna. Some portion of this transmit power will be coupled back to the transceiver, and as a result, its performance is at risk.

Therefore, what is needed and what is provided is an antenna power coupler having a variable coupling factor to extend the dynamic range of detection receiver used to decrease calibration times and to protect transceiver components from damage or degraded performance.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
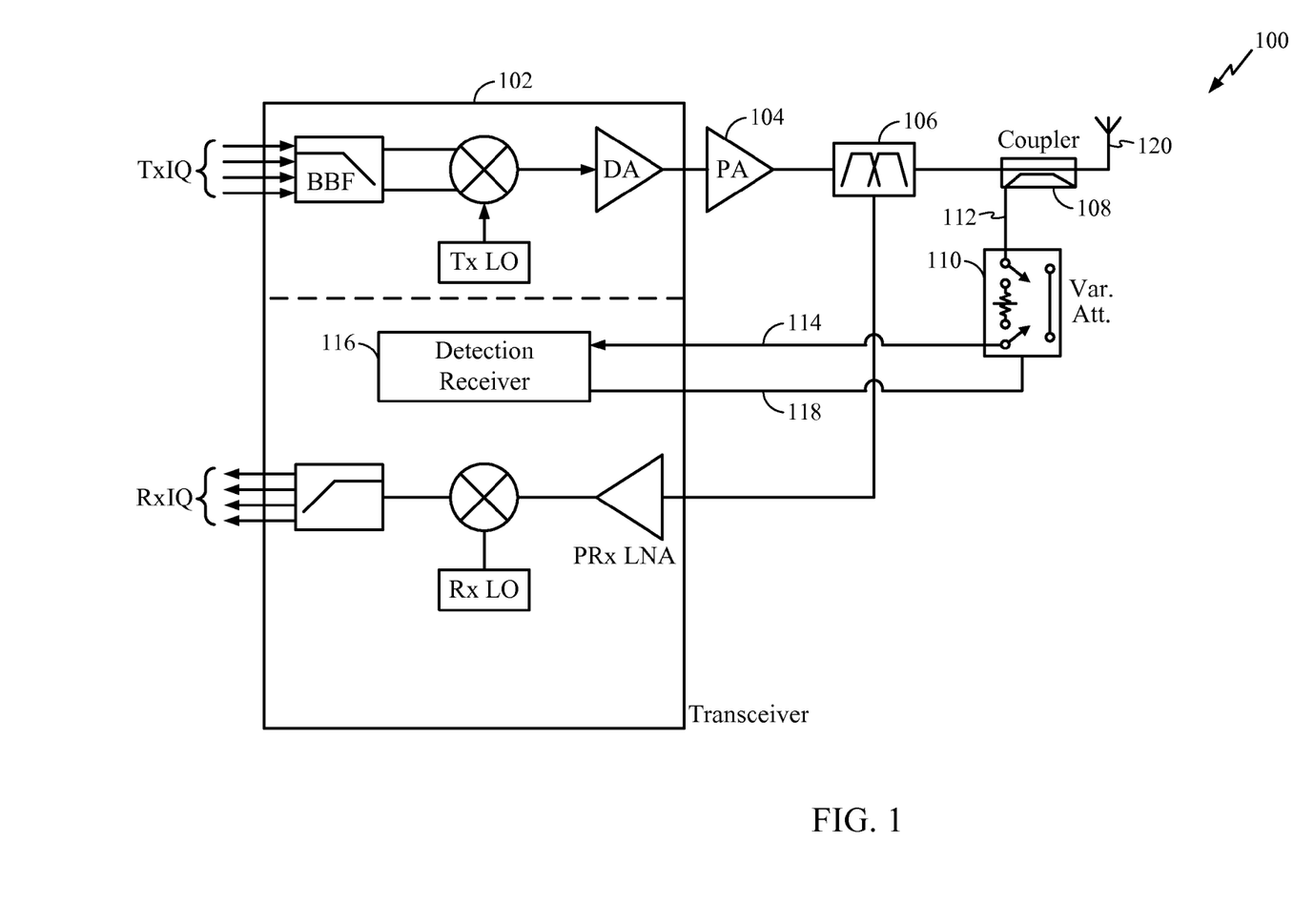
FIG. 1 illustrates a device that comprises an exemplary embodiment of an antenna power coupler and variable attenuator that provide receiver protection and fast calibration.

FIG. 1 illustrates a device 100 that comprises an exemplary embodiment of an antenna power coupler 108 and variable attenuator 110 that provide receiver protection and fast self calibration. For example, the device 100 comprises transceiver 102, power amplifier 104, filter 106, antenna power coupler 108, and variable attenuator 110. The antenna power coupler 108 is configured to sense the transmit power of a transmitted signal over a wide frequency band and to generate a power detection signal 112. The variable attenuator 110 is configured to adjust the level of the power detection signal 112 and pass this adjusted detection signal 114 to the transceiver 102 where it is received by a detection receiver 116. The detection receiver 116 is configured to output an attenuator control signal 118 to control the attenuator settings of the variable attenuator 110 adjust the level of the adjusted detection signal 114 so as to protect transceiver electronics from damage or degraded performance. The detection receiver 116 also operates to provide information about the adjusted detection signal to the device 100 for self calibration purposes.

During operation, transmissions from the transceiver 102 flow through the power amplifier 104 and filter 106 to the antenna 120. The coupler 108 operates to detect the power of the transmissions over a wide band. The detection receiver 116 operates to adjust the amount of attenuation provided by the variable attenuator 110 to ensure that a maximum power of approximately 0 dBm is fed back to the detection receiver 116 regardless of frequency band or transmission technology being utilized. For example, in one exemplary implementation, the variable attenuator 110 is set to accommodate the following maximum transmission power levels for the identified transmission technologies to ensure that a maximum power of approximately 0 dBm is fed back to the detection receiver 116.

Figure 2:
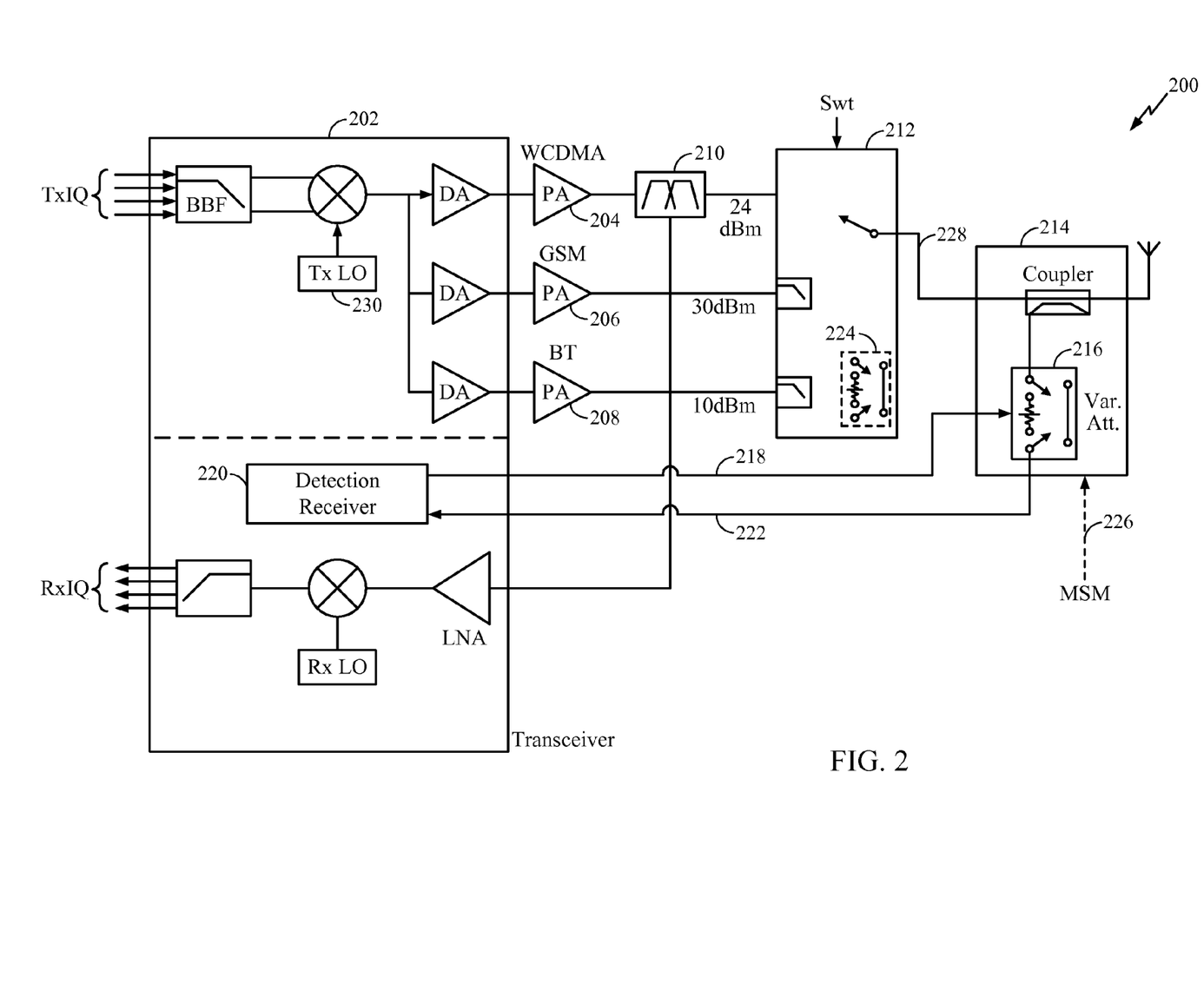
FIG. 2 illustrates a device comprising an exemplary embodiment of an antenna power coupler and variable attenuator located after an antenna switch.

1. Wide band code division multiple access (WCDMA)
   WCDMA/CDMA2000 max power=24 dBm
2. Long term evolution (LTE)
   LTE max power=10 dBm to 24 dBm
3. Global system for mobile communication (GSM)
   GSM max power=30 dBm
4. Wireless local area network (WLAN)
   WLAN max power=23 dBm
5. Bluetooth (BT)
   BT max power=10 dBm FIG. 2 illustrates a device 200 comprising an exemplary embodiment of an antenna power coupler 214 and variable attenuator 216 located after an antenna switch 212. For example, the device 200 comprises transceiver 202, power amplifiers 204, 206, and 208, filter 210, antenna switch 212, and wide band antenna power coupler 214. The antenna coupler 214 comprises variable attenuator 216. A detection receiver 220 outputs an attenuator control signal 218 to control the variable attenuator 216. The detection receiver 220 also receives an adjusted detected power signal 222 from the variable attenuator 216.

In this exemplary implementation, the coupler 214 and variable attenuator 216 are provided after the antenna switch 212. The antenna power coupler 214 is configured to sense the transmit power of a transmitted signal and to generate a detection signal that is input to the variable attenuator 216, which adjusts the level of the detection signal and passes this adjusted detection signal 222 to the detection receiver 220.

Receiver Protection

In exemplary embodiments, the wide-band power coupler 214 and variable attenuator 216 are provided for use in the wireless device 200 to provide protection of the transceiver 202. For example, during transmission of a high power Tx signal 228, if the output of the coupler 214 is fed back to the transceiver 202 without attenuation, it may result in corrupting the Tx signal 228, the local oscillator 230, or cause VCO pulling. Thus, the variable attenuator 216 provides a variable coupling factor to attenuate the output of the coupler 214 to generate the adjusted detected power signal 222 fed back to the detection receiver 220 to protect the transceiver 202 against high power Tx signals that may degrade transceiver performance.

Self Calibration

In exemplary embodiments, the wide-band power coupler 214 and variable attenuator 216 combine to form a power coupler with variable coupling factor for use during self calibration in the wireless device 200. For example, the device 200 is capable of transmitting using multiple frequency bands and/or transmission protocols using the power amplifiers 204, 206 and 208. Fast self calibration is facilitated by using the detection receiver 220 to measure the power of the Tx signal 228 during transmission using one of the various frequency bands/transmission protocols that are available. The variable attenuator 216 applies selected attenuation to make sure the detection receiver 220 is not overloaded by the adjusted detected power signal 222 during high power transmissions, for instance, when transmitting in GSM mode. Thus, the attenuator 216 provides a variable coupling factor to increase the dynamic range of the detection receiver 220 and to facilitate fast self calibration in the device 200 when transmitting using one of multiple frequency bands and/or transmission protocols that are available.

During operation, the transceiver 202 operates to select one of three transmission technologies with which to transmit signals. For example, if WCDMA technology is selected, the transceiver 202 utilizes the power amplifier 204. If GMS technology is selected, the transceiver 202 utilizes the power amplifier 206. If Bluetooth technology is selected, the transceiver 202 utilizes the power amplifier 208. Each technology has it own maximum power characteristics, for example, WCDMA is 24 dBm, GSM is 30 dBm, and BT is 10 dBm.

Based on the transmission technology selected, the detection receiver 220 operates to control the variable attenuator 216 using the attenuator control signal 218 so that approximate 0 dBm or less is received on the adjusted detected power signal 218 from the variable attenuator 216. The detection receiver 220 may also control the attenuator 216 such that other maximum power levels are received on the adjusted detected power signal 218. Thus, for any selected transmission technology, the detection receiver 220 operates to adjust the variable attenuator 216 to protect the receiver circuitry and provide for fast self calibration. It should also be noted that in this exemplary embodiment, the variable attenuator 216 is included in the wide band power coupler 214, however, in another exemplary embodiment, the variable attenuator may be integrated into the antenna switch 212, as illustrated by the optional variable attenuator 224. In still another exemplary embodiment, a mobile station modem (MSM) located at the device operates to send an attenuator control signal 226 to the variable attenuator 216 to control the attenuator setting.

Figure 3:
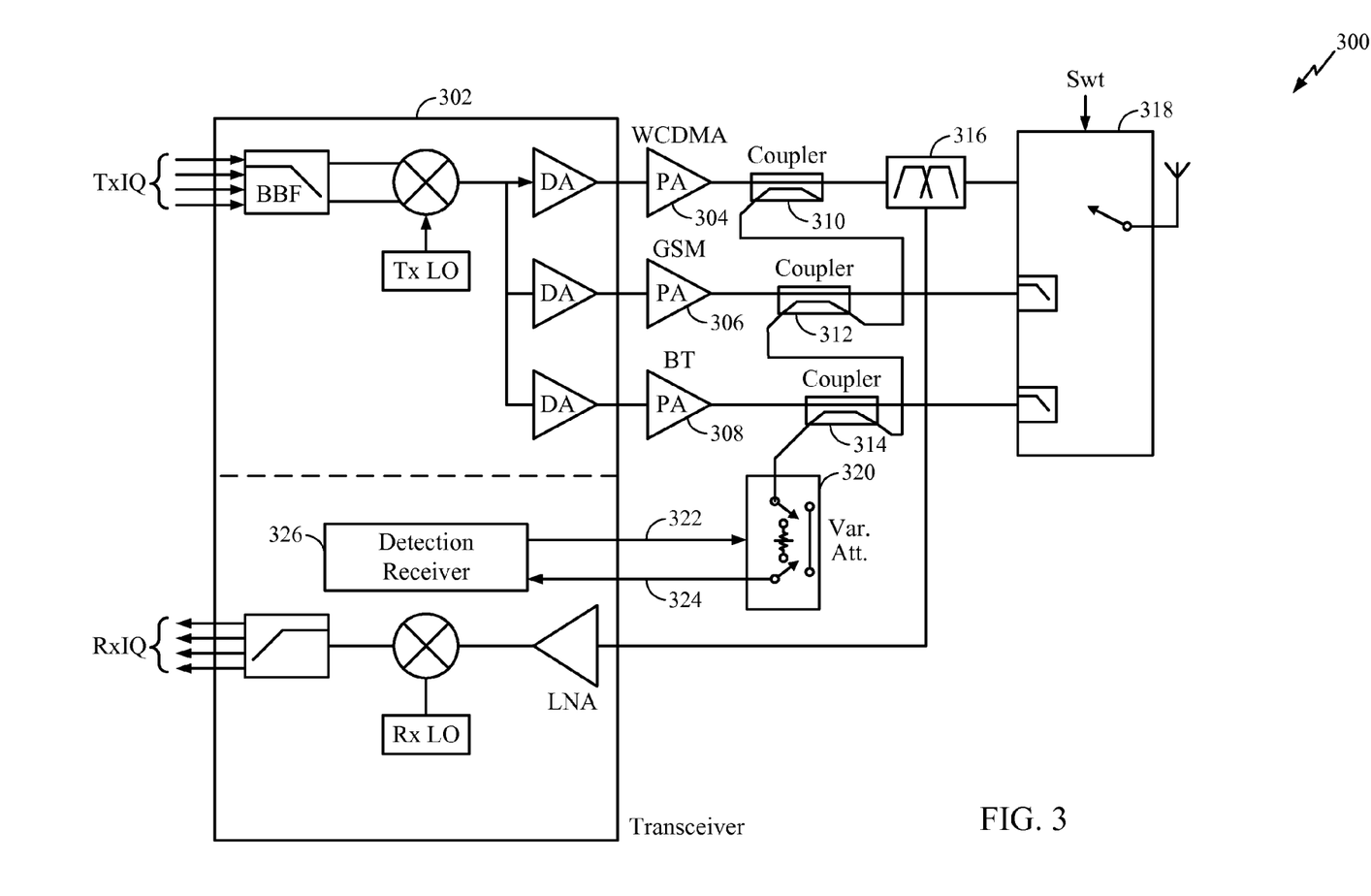
FIG. 3 illustrates a device comprising an exemplary embodiment of a plurality of power couplers and a variable attenuator located after power amplification but before an antenna switch.

FIG. 3 illustrates a device 300 comprising an exemplary embodiment of power couplers 310, 312, and 314 and variable attenuator 320 located after power amplification but before an antenna switch 318. For example, the device 300 comprises transceiver 302, power amplifiers 304, 306, 308, and power couplers 310, 312, and 314. The device also comprises filter 316, antenna switch 318, variable attenuator 320 and detection receiver 326.

In this exemplary embodiment, the power couplers 310, 312, and 314 are coupled to receive the output of the amplifiers 304, 306, and 308, respectively. The power couplers 310, 312, and 314 are daisy chained together with the output of the daisy chain connected to the variable attenuator 320. The output of the attenuator 320 is input to the detection receiver 326. Thus, for any selected transmission technology, the appropriate power coupler operates to provide a power detection signal that is input to the attenuator 320. The detection receiver 326 operates to adjust the variable attenuator 320 to adjust the level of the power detection signal to protect the transceiver circuitry and provide for fast self calibration.

It should also be noted that in this exemplary embodiment, the variable attenuator 320 is provided as a stand alone module that receives input from the daisy chained couplers 310, 312, and 314, however, in another exemplary embodiment, the couplers 310, 312, and 314 each comprise a variable attenuator and a separate switch controllable by the detection receiver 326 is used to select one of the attenuator outputs to be input to the detection receiver 326.

Figure 4:
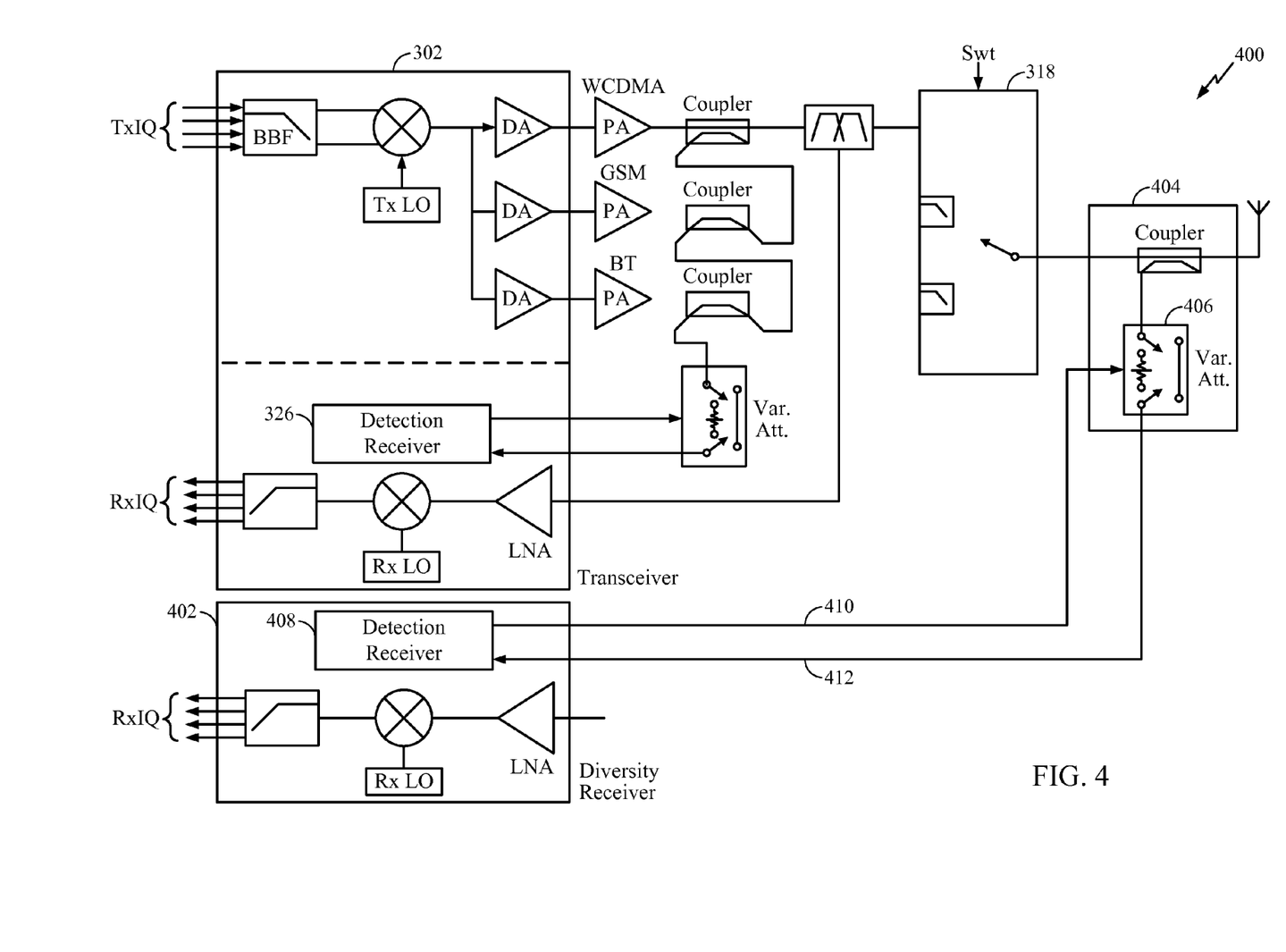
FIG. 4 illustrates a device comprising an exemplary embodiment of an antenna coupler and variable attenuator for use in a diversity path receiver.

FIG. 4 illustrates a device 400 comprising an exemplary embodiment of antenna coupler 404 and variable attenuator 406 for use in a diversity path receiver 402. For example, the device 400 comprises the transceiver 302 and associated circuitry from the device 300 shown in FIG. 3. The device 400 further comprises a diversity receiver 402 and wide band power coupler 404. The power coupler 404 comprises a variable attenuator 408. The diversity receiver 402 includes a detection receiver 410 that outputs attenuation control signal 412 to the attenuator 408 and receives an adjusted detection signal 414. The diversity path receiver 402 is used for calibration and can be used to increase dynamic range or in exemplary implementations where multiple power amplifiers are daisy-chained.

Figure 5:
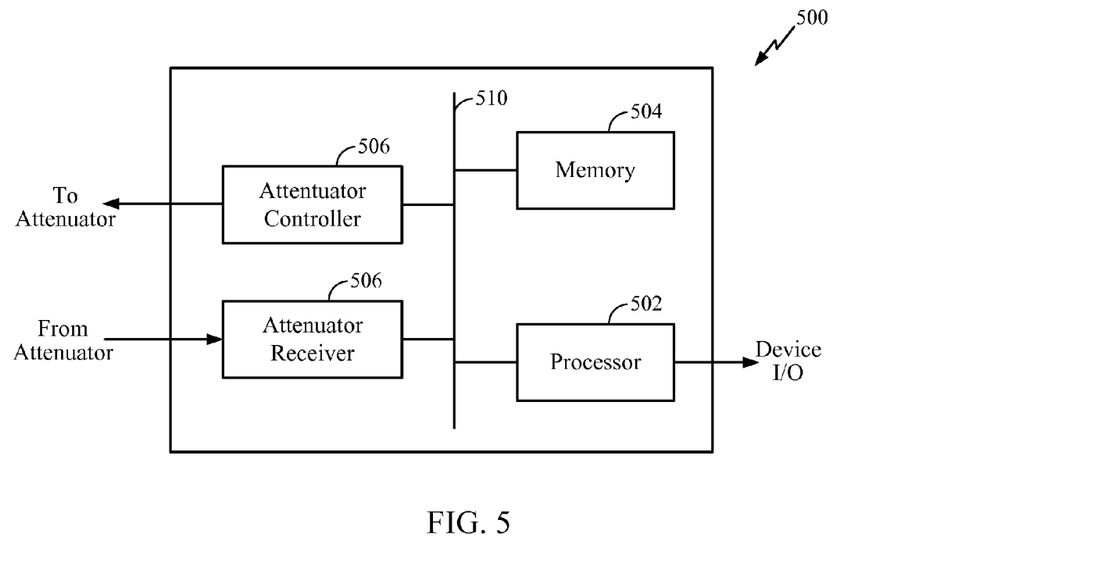
FIG. 5 shows an exemplary embodiment of a detection receiver.

FIG. 5 shows an exemplary embodiment of a detection receiver 500. For example, the detection receiver 500 is suitable for use as the detection receiver 116, 220, 326, or 408. The detection receiver 500 comprises processor 502, memory 504, attenuation controller 506, and attenuation receiver 508 all coupled to communicate using bus 510. It should be noted that the detection receiver 500 is just one exemplary implementation and that other implementations are possible.

The attenuation controller 506 comprises hardware and/or hardware executing software that operates to allow the detection receiver 500 to communicate control commands to a variable attenuator, such as the variable attenuator 320 shown in FIG. 3. In one exemplary implementation, the attenuation controller 506 is hardwired to a variable attenuator and communicates commands to set an attenuation factor of the variable attenuator. The attenuation controller 506 receives instructions from the processor 502 using the bus 510, and uses these instructions to determine commands to be output to a variable attenuator.

The attenuation receiver 508 comprises hardware and/or hardware executing software that operates to allow the detection receiver 500 to receive adjusted detection signals from a variable attenuator, such as the variable attenuator 320 shown in FIG. 3. In one exemplary implementation, the attenuation receiver 508 is hardwired to a variable attenuator to receive the adjusted detection signal. The attenuator receiver 508 receives instructions from the processor 502 using the bus 510, and uses these instructions to determine how to process adjusted detection signals that are received. In an exemplary embodiment, the adjusted detection signals are passed to the processor 502 using bus 510.

The memory 504 comprises any suitable memory device, such as RAM, ROM, EEPROM or any other suitable device configured to store information that can be accessed using the bus 510. For example, in one exemplary embodiment, the memory 504 stores attenuation settings associated with one or more transmission technologies. During transmission using a particular transmission technology, such as WCDMA, the associated attenuation setting can be accessed and sent out by the attenuation controller 506 to set the operation of a variable attenuator so that an adjusted detection signal received by the attenuator receiver 508 has a selected maximum power level.

The processor 502 comprises at least one of a CPU, processor, gate array, hardware logic, memory elements, and/or hardware executing software. The processor 502 operates to control the detection receiver 500 to provide the functions described herein to protect transceiver circuitry and facilitate fast self calibration. The processor 502 communicates with other functional modules of the detection receiver 500 using the bus 510. In an exemplary embodiment, the processor 502 communicates with a device, such as an MSM, using a device input/output (I/O) interface. The processor 502 can receive information from the device, such as attenuator settings, control instructions, or any other type of instructions, control information or data to be used during the operation of the detection receiver 500. The processor 502 also outputs information to the device using the device I/O. For example, the processor 502 outputs information about adjusted detection signals received by the attenuator receiver 508. This information can be used by the device to facilitate fast self calibration.

The processor 502 also communicates with the memory 504 using the bus 510 to store, retrieve, access or otherwise maintain information in the memory 504. A more detailed description of the operation of the detection receiver 500 is provided below.

Figure 7:
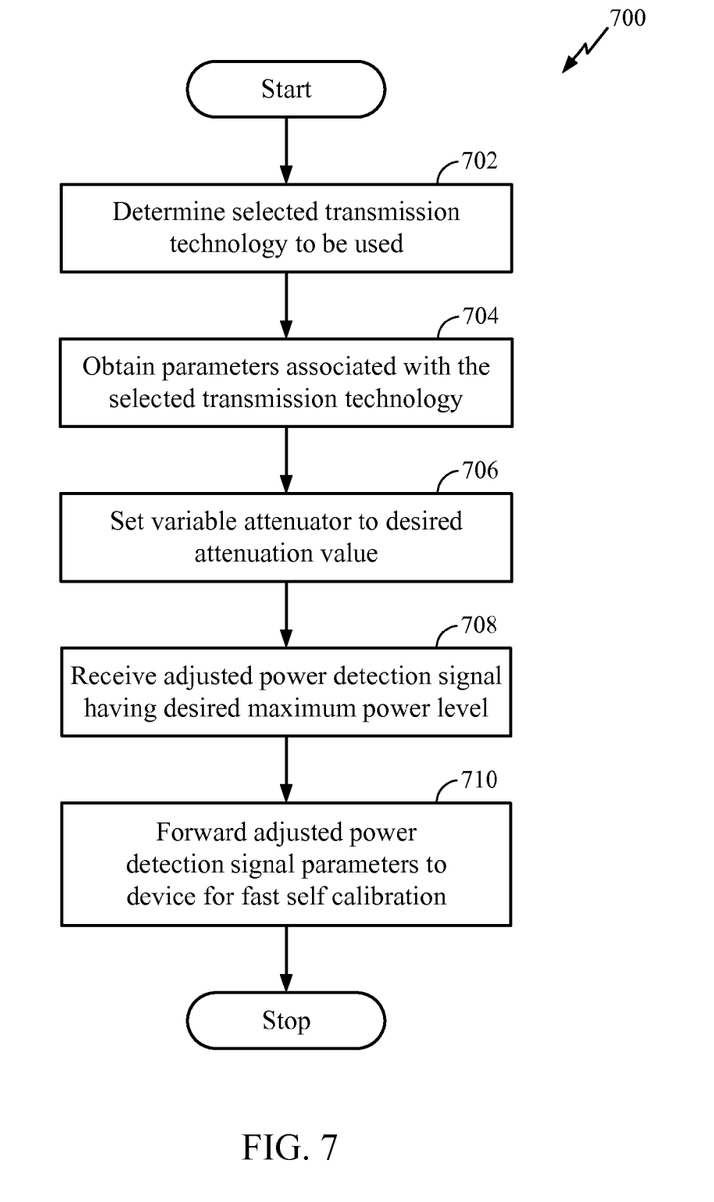
FIG. 7 shows an exemplary embodiment of a method for protecting a transceiver in a wireless device from excessive transmission power feedback.

Referring now to FIG. 7, an exemplary embodiment of a method 700 is shown. The method 700 operates to protect a transceiver in a wireless device from excessive transmission power feedback. The wireless device is capable of transmitting data using one or more frequency bands and/or transmission technologies. The method 700 also facilitates fast self calibration in a wireless device. For example, the method 700 is described with respect to the operation of the device 300 shown in FIG. 3 and the receiver protection module 500 shown in FIG. 5. In an exemplary embodiment, the processor 502 executes one or more sets of codes to perform the functions described below.

At block 702, a selected transmission technology for transmitting data is determined. For example, the processor 502 receives information about the determined transmission technology from the wireless device using the device I/O interface.

At block 704, parameters associated with the selected transmission technology are obtained. For example, the processor 502 accesses the memory 504 to obtain the parameters. In an exemplary embodiment, the parameters include attenuation settings associated with one or more transmission technologies.

At block 706, a selected variable attenuator is set to provide a selected level of attenuation. For example, the processor 502 controls the attenuation controller 506 to send commands to the selected attenuator to set its attenuation factor. As a result, the selected attenuator will receive the output of the selected wide band power coupler (power detection signal) as its input, provide the selected amount of attenuation, and output an adjusted power detection signal.

At block 708, the adjusted power detection signal is received that has the desired maximum power level. For example, the adjusted power detection signal 324 is output from the variable attenuator 320 and received at the detection receiver 326. The adjust power detection signal 324 is adjusted to have a maximum power level determined by the setting of the variable attenuator 320 so that the level is safe and will not damage or degrade the operation of the transceiver 302.

At block 710, the received adjusted power detection signal is sent to the wireless device to facilitate self calibration. For example, the processor 502 sends information about the received adjusted power detection signal to the wireless device using the device I/O.

Therefore, in exemplary embodiments, the method 700 is performed by a detection receiver located at a wireless device. It should be noted that the method 700 is just one exemplary implementation and that the operations of the method 700 may be rearranged or otherwise modified within the scope of the various exemplary embodiments such that other exemplary implementations are possible.

Figure 6:
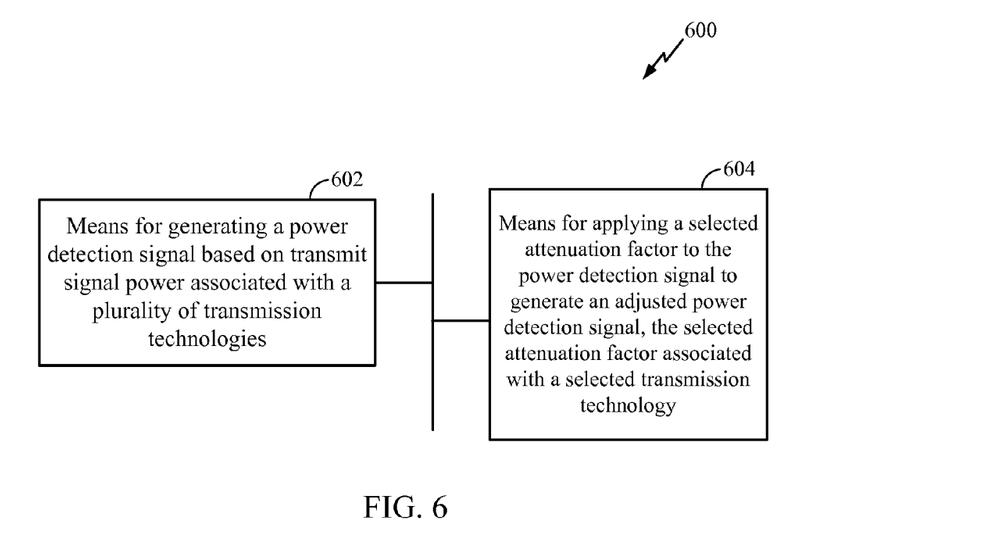
FIG. 6 shows an exemplary embodiment of an apparatus to protect a transceiver from excessive transmission power feedback.

Referring now to FIG. 6 an exemplary embodiment of an apparatus 600 is shown. The apparatus 600 operates to protect a transceiver from excessive transmission power feedback and to facilitate fast self calibration. In an aspect, the apparatus 600 is implemented by one or more modules configured to provide the functions as described herein. For example, in an aspect, each module comprises hardware and/or hardware executing software.

The apparatus 600 comprises a first module comprising means (602) for generating a power detection signal based on transmit signal power associated with a plurality of transmission technologies, which in an aspect comprises the power couplers 310, 312, and 314.

The apparatus 600 also comprises a second module comprising means (604) for applying a selected attenuation factor to the power detection signal to generate an adjusted power detection signal, the selected attenuation factor associated with a selected transmission technology, which in an aspect comprises the variable attenuator 320.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media (i.e., computer program product) may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other exemplary embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. Apparatus comprising:
    a coupler configured to generate a power detection signal based on transmit signal power associated with a plurality of transmission technologies;
    a variable attenuator configured to apply a selected attenuation factor to the power detection signal to generate an adjusted power detection signal that is maintained below a fixed threshold level, the selected attenuation factor is applied by the variable attenuator during all transmit signal powers associated with a selected transmission technology; and
    a detection receiver configure to retrieve the selected attenuation factor from a memory based on the selected transmission technology and input the selected attenuation factor to the variable attenuator.

2. The apparatus of claim 1, further comprising a detection receiver configured to generate an attenuator control signal based on the selected transmission technology to set the selected attenuation factor of the variable attenuator.

3. The apparatus of claim 2, the coupler, variable attenuator, and detection receiver are provided in a transceiver.

4. The apparatus of claim 1, the coupler comprises a wide band coupler.

5. The apparatus of claim 1, the coupler comprises the variable attenuator.

6. The apparatus of claim 1, the adjusted power detection signal is generated to have a power level that is maintained below the fixed threshold level of approximately 0 dBm.

7. The apparatus of claim 1, the plurality of transmission technologies comprise wide band code division multiple access (WCDMA), long term evolution (LTE), global system for mobile communication (GSM), wireless local area network (WLAN), and Bluetooth transmission technologies.

8. The apparatus of claim 1, the coupler is configured to couple to a transmission signal path on an input side of an antenna switch.

9. The apparatus of claim 1, the coupler is configured to couple to a transmission signal path on an output side of an antenna switch.

10. The apparatus of claim 1, the variable attenuator is included in an antenna switch.

11. Apparatus comprising:
 means for generating a power detection signal based on transmit signal power associated with a plurality of transmission technologies;
 means for applying a selected attenuation factor to the power detection signal to generate an adjusted power detection signal that is maintained below a fixed threshold level, the selected attenuation factor is applied during all transmit signal powers associated with a selected transmission technology; and
 means for retrieving the selected attenuation factor from a memory based on the selected transmission technology and inputting the selected attenuation factor to the variable attenuator.

12. The apparatus of claim 11, further comprising means for generating an attenuator control signal based on the selected transmission technology to set the selected attenuation factor.

13. The apparatus of claim 11, the means for generating configured to operate over a wide frequency band.

14. The apparatus of claim 11, the means for applying configured to generate the adjusted power detection signal to have a power level that is maintained below the fixed threshold level of approximately 0 dBm.

15. The apparatus of claim 11, the means for generating configured to generate the power detection signal based on the transmit signal power associated with wide band code division multiple access (WCDMA), long term evolution (LTE), global system for mobile communication (GSM), wireless local area network (WLAN), and Bluetooth transmission technologies.

16. The apparatus of claim 11, the means for generating is coupled to an input of a means for antenna switching.

17. The apparatus of claim 11, the means for generating is coupled to an output of a means for antenna switching.

18. The apparatus of claim 11, the means for applying included in a means for antenna switching.

19. A method comprising:
 generating a power detection signal based on transmit signal power associated with a plurality of transmission technologies;
 retrieving a selected attenuation factor from a memory based on a selected transmission technology; and
 applying the selected attenuation factor to the power detection signal to generate an adjusted power detection signal that is maintained below a fixed threshold level, and wherein the selected attenuation factor is applied during all transmit signal powers associated with a selected transmission technology.

20. The method of claim 19, the generating configured to generate the power detection signal based on the transmit signal power associated with wide band code division multiple access (WCDMA), long term evolution (LTE), global system for mobile communication (GSM), wireless local area network (WLAN), and Bluetooth transmission technologies.

* * * * *